(12) United States Patent
Kim et al.

(10) Patent No.: US 12,178,065 B2
(45) Date of Patent: Dec. 24, 2024

(54) ORGANIC LIGHT EMITTING DISPLAY DEVICE

(71) Applicant: LG Display Co., Ltd., Seoul (KR)

(72) Inventors: Chi-Woong Kim, Goyang-si (KR); Min-Ho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/327,624

(22) Filed: Jun. 1, 2023

(65) Prior Publication Data
US 2023/0329031 A1    Oct. 12, 2023

Related U.S. Application Data

(63) Continuation of application No. 17/501,273, filed on Oct. 14, 2021, now Pat. No. 11,706,941, which is a continuation of application No. 16/190,852, filed on Nov. 14, 2018, now Pat. No. 11,171,305.

(30) Foreign Application Priority Data

Nov. 23, 2017   (KR) ........................ 10-2017-0157583

(51) Int. Cl.
| | |
|---|---|
| H10K 59/122 | (2023.01) |
| H10K 50/84  | (2023.01) |
| H10K 50/844 | (2023.01) |
| H10K 59/131 | (2023.01) |
| H10K 77/10  | (2023.01) |
| H10K 102/00 | (2023.01) |

(52) U.S. Cl.
CPC ......... *H10K 50/84* (2023.02); *H10K 50/8445* (2023.02); *H10K 59/122* (2023.02); *H10K 59/131* (2023.02); *H10K 77/111* (2023.02); *H10K 2102/311* (2023.02)

(58) Field of Classification Search
CPC .... H10K 50/84; H10K 59/131; H10K 59/122; H10K 50/8445; H10K 77/111
See application file for complete search history.

(56) References Cited

U.S. PATENT DOCUMENTS

| | | | |
|---|---|---|---|
| 9,767,727 | B2 | 9/2017 | Byun et al. |
| 10,276,646 | B2 | 4/2019 | Kim et al. |
| 10,522,431 | B2 | 12/2019 | Kim et al. |
| 2014/0217397 | A1 | 8/2014 | Kwak et al. |
| 2016/0225312 | A1 | 8/2016 | Byun et al. |
| 2016/0293884 | A1 | 10/2016 | Zhang et al. |
| 2016/0307971 | A1 | 10/2016 | Jeon |

(Continued)

FOREIGN PATENT DOCUMENTS

| | | |
|---|---|---|
| CN | 107255655 A | 10/2017 |
| EP | 3098869 A1 | 11/2016 |

(Continued)

*Primary Examiner* — Victor A Mandala
*Assistant Examiner* — Colleen E Snow
(74) *Attorney, Agent, or Firm* — Seed IP Law Group LLP

(57) ABSTRACT

Disclosed is an organic light emitting display device which may improve reliability. The organic light emitting display device includes light emitting elements arranged in an active area, crack prevention layers arranged in a non-active area along the perimeter of the active area, and at least one crack detection line arranged between the active area and the crack prevention layers, and judges whether or not a crack is generated through an output resistance value from the at least one crack detection line and may thus raise yield.

20 Claims, 15 Drawing Sheets

(56) References Cited

U.S. PATENT DOCUMENTS

2016/0315284 A1    10/2016  Jeon
2016/0322451 A1    11/2016  Park
2018/0102502 A1     4/2018  Kim et al.

FOREIGN PATENT DOCUMENTS

KR    10-2014-0103025 A     8/2014
KR    10-2016-0124301 A    10/2016
KR    10-2017-0107136 A     9/2017

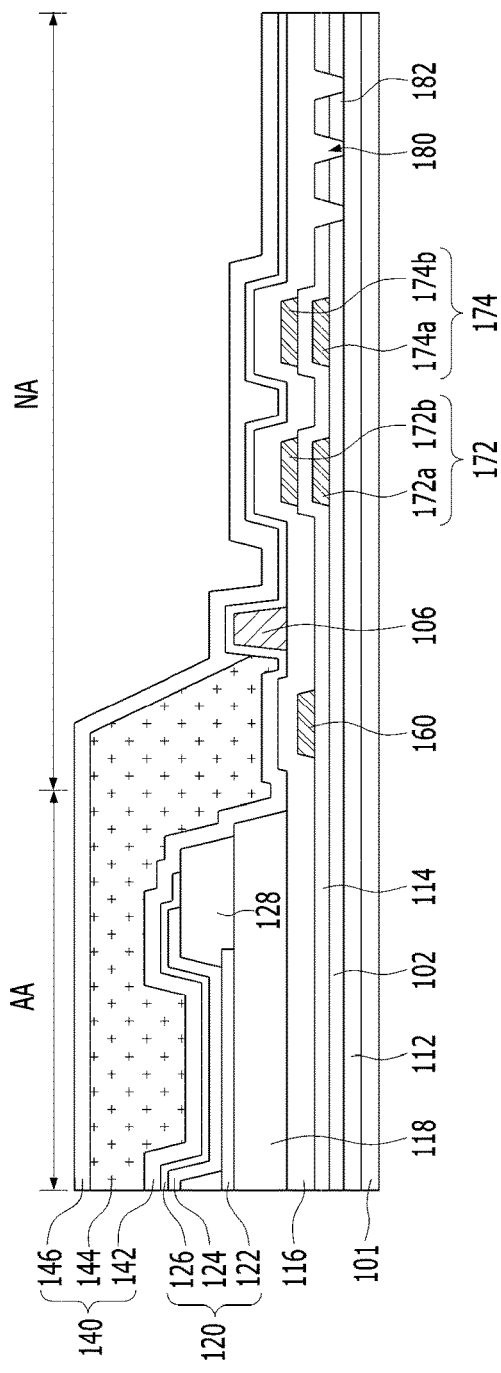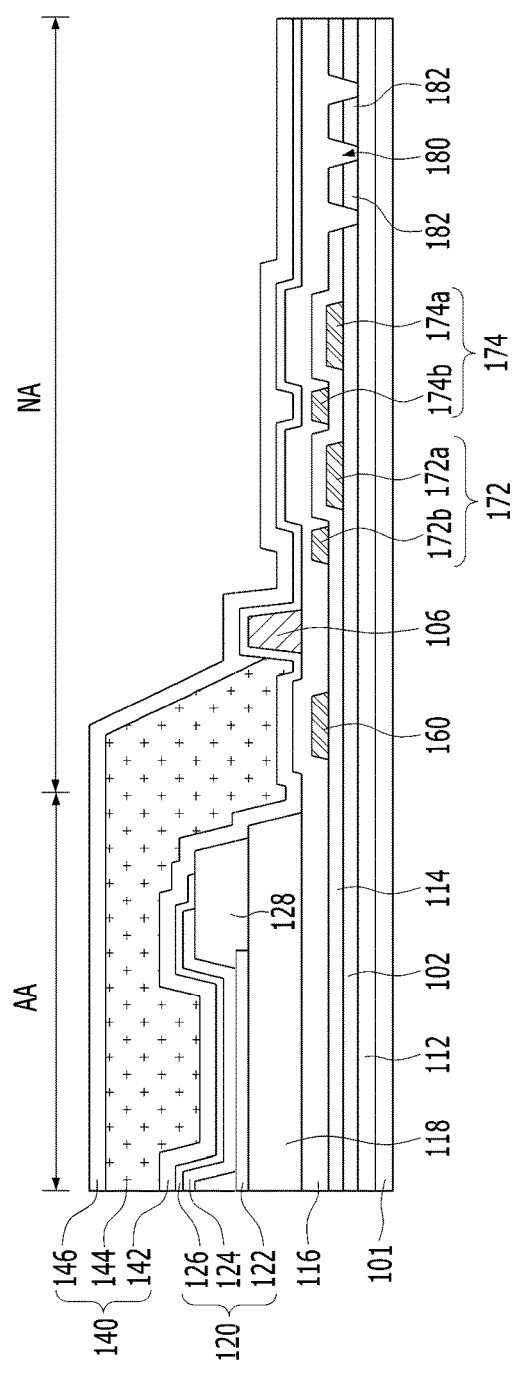

ORGANIC LIGHT EMITTING DISPLAY DEVICE

CROSS-REFERENCE TO RELATED APPLICATION(S)

This application is a continuation of U.S. application Ser. No. 16/190,852, filed on Nov. 14, 2018, which claims the benefit of Korean Patent Application No. 10-2017-0157583, filed on Nov. 23, 2017, which is hereby incorporated by reference as if fully set forth herein.

BACKGROUND

Technical Field

The present disclosure relates to an organic light emitting display device, and more particularly, to an organic light emitting display device which may improve reliability.

Description of the Related Art

Image display devices, which display various pieces of information on a screen, are a core technology in the age of information and communication and have been developed to satisfy thinness, light-weight, portability and high-performance trends. Therefore, as a flat panel display device which can reduce weight and volume to make up for drawbacks of a cathode ray tube (CRT), an organic light emitting display device (OLED), which controls the amount of light emitted from an organic light emitting layer and thus displays an image, is now in the spotlight. Such an organic light emitting display device is a self-luminous display and has advantages, such as low power consumption, high response speed, high luminous efficacy, high brightness and wide viewing angle.

Such an organic light emitting display device is formed mainly using an organic thin film having flexibility and elasticity and may thus be implemented as a flexible display device. However, in the case of a flexible organic light emitting display device, cracks are easily generated by external force during movement or handling of the flexible organic light emitting display device. If external moisture or oxygen penetrates into the organic light emitting display device through such cracks, elements in the organic light emitting display device are easily oxidized and, thus, reliability of the organic light emitting display device may be lowered.

BRIEF SUMMARY

Accordingly, the present disclosure is directed to an organic light emitting display device that substantially obviates one or more problems due to limitations and disadvantages of the related art.

In various embodiments, the present disclosure provides an organic light emitting display device which may improve reliability.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light emitting display device is provided that includes light emitting elements positioned in an active area of the display device, a crack prevention layer positioned in a non-active area of the display device, the non-active area positioned adjacent to a perimeter of the active area, and at least one crack detection line positioned between the active area and the crack prevention layer. The at least one crack detection element may be utilized to determine whether or not a crack is generated through measuring an output resistance value of the at least one crack detection line and may thus raise yield.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 7 is a cross-sectional view illustrating an organic light emitting display device in accordance with another embodiment of the present disclosure;

FIG. 8 is a cross-sectional view illustrating another embodiment of crack detection lines shown in FIG. 7;

DETAILED DESCRIPTION

Reference will now be made in detail to the preferred embodiments of the present disclosure, examples of which are illustrated in the accompanying drawings.

Figure 1:
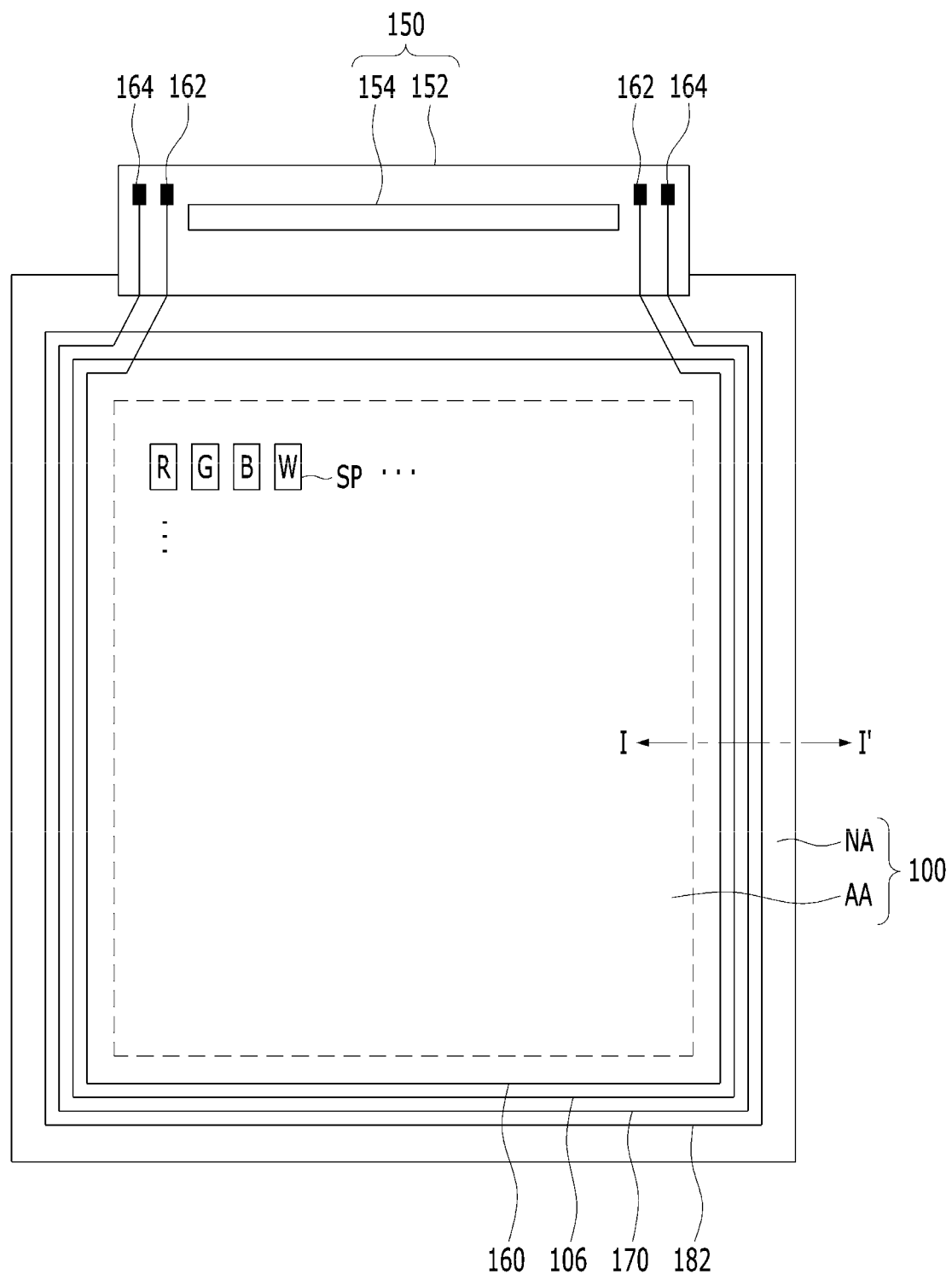
FIG. 1 is a plan view illustrating an organic light emitting display device in accordance with one embodiment of the present disclosure.

FIG. 1 is a plan view illustrating an organic light emitting display device in accordance with one embodiment of the present disclosure.

The organic light emitting display device shown in FIG. 1 includes an organic light emitting display panel 100, and a driving unit 150 to drive the organic light emitting display panel 100.

The driving unit 150 includes a circuit film 152 and a driving integrated circuit 154 mounted on the circuit film 152.

The driving integrated circuit 154 generates a driving signal, etc. to drive the organic light emitting display panel 100 and supplies the driving signal to the organic light emitting display panel 100 through the circuit film 152.

One end of the circuit film 152 is connected to pad parts of the organic light emitting display panel 100, and the other end of the circuit film 152 is connected to a printed circuit board, on which a timing controller, a power supply, etc. are mounted. Therefore, power voltage generated by the power supply is supplied to a power line 160 of the organic light emitting display panel 100 through power supply terminals 162 disposed on the circuit film 152. Here, power voltage includes at least one of reference voltage, high voltage or low voltage. Although FIG. 1 illustrates only one power line 160, two or more power lines 160 may be formed so as to supply a plurality of different driving voltages. Such a power line 160 is arranged inside a dam 106 in a non-active area NA, and a crack detection line 170 and crack prevention layers 182, which are parallel to the power line 160, are arranged outside the dam 106 in the non-active area NA. The crack detection line 170 may take the form of a circuit element, a conductive member, a circuit member, a conductive interconnection line, a line through which a current runs as a circuit element, a connection to a resistor, a capacitor plate, an inductor winding, a circuit connection to a capacitor, or any conductive line. The term crack detection line is therefore used herein in the broadest sense include a member, element or any of the examples provided herein. If a particular meaning that is only a subset of the broad definition stated above for a selected embodiment, it will be particularly stated and explained for that embodiment.

The organic light emitting display panel 100 is divided into an active area AA provided on a substrate 101, and the non-active area NA arranged around the active area AA. If the substrate 101 is a glass or plastic substrate, the substrate 101 may be formed of a polyimide-based or polycarbonate-based material and thus have flexibility.

Figure 2:
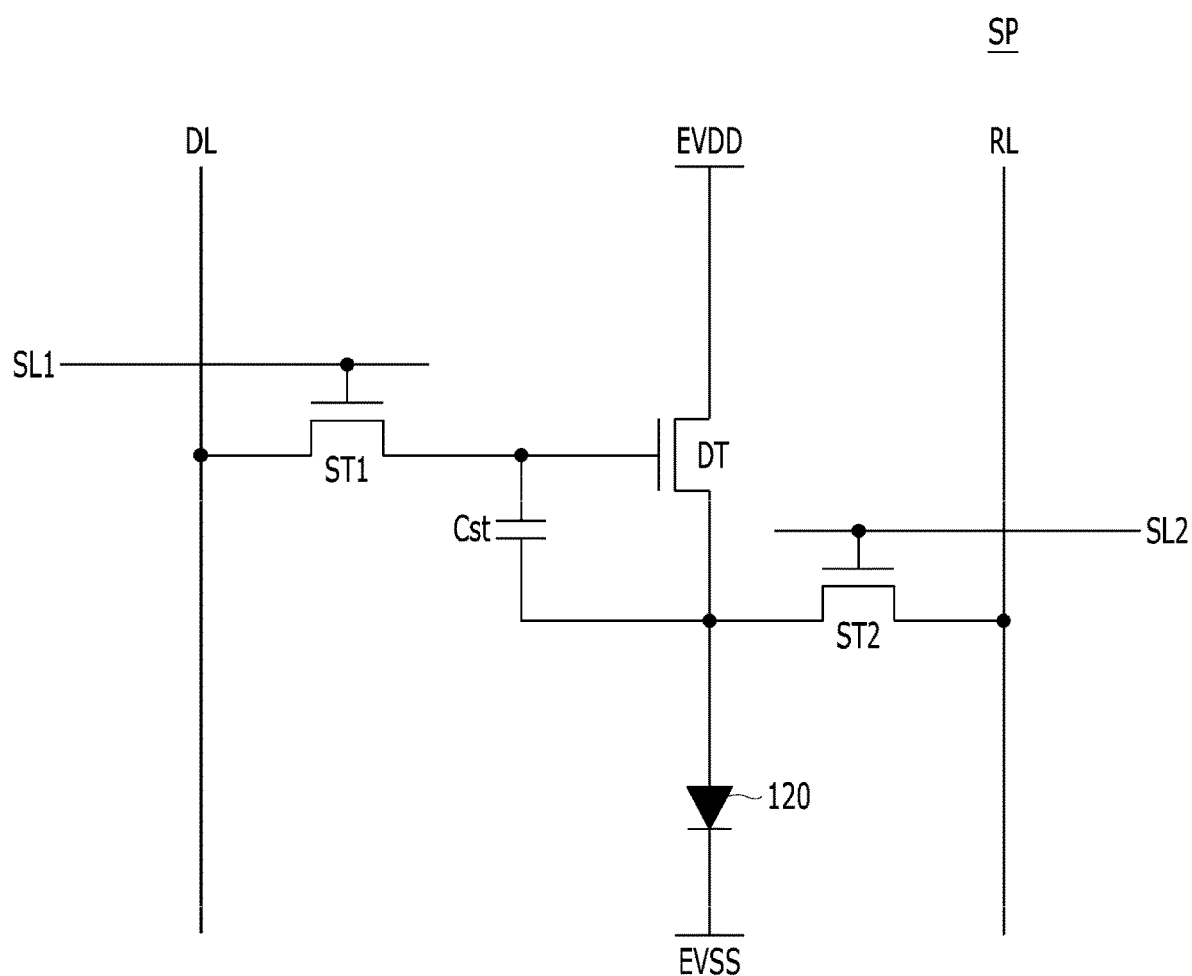
FIG. 2 is a circuit diagram illustrating a sub-pixel shown in FIG. 1.

The active area AA displays an image through unit pixels arranged in a matrix. The unit pixel includes red (R), green (G) and blue (B) sub-pixels SP or includes red (R), green (G), blue (B) and white (W) sub-pixels SP. Each of the sub-pixels SP includes a pixel driving circuit and a light emitting element 120 connected to the pixel driving circuit, as exemplarily shown in FIG. 2.

The pixel driving circuit includes first and second switching transistors ST1 and ST2, a driving transistor DT and a storage capacitor Cst. Here, the pixel driving circuit is not limited to the configuration of FIG. 2 and pixel driving circuits having various configurations may be used.

The storage capacitor Cst is connected between a scan terminal of the driving transistor DT and a low voltage (EVSS) supply line, charges differential voltage therebetween and supplies it as driving voltage of the driving transistor DT.

The first switching transistor ST1 is turned-on under control of a first scan line SL1 and transmits data voltage from a data line DL to a gate electrode of the driving transistor DT.

The second switching transistor ST2 is turned-on under control of a second scan line SL2 and transmits reference voltage from a reference line RL to a source electrode of the driving transistor DT. Further, the second switching transistor ST2 may transmit current of the driving transistor DT to the reference line RL in a sensing mode. The first and second switching transistors ST1 and ST2 may be controlled by the different scan lines SL1 and SL2 or controlled by the same scan line.

The driving transistor DT is switched by a data signal supplied from the first switching transistor ST1 and thus controls current transmitted from a high voltage (EVDD) supply line to the organic light emitting element 120.

Figure 3:
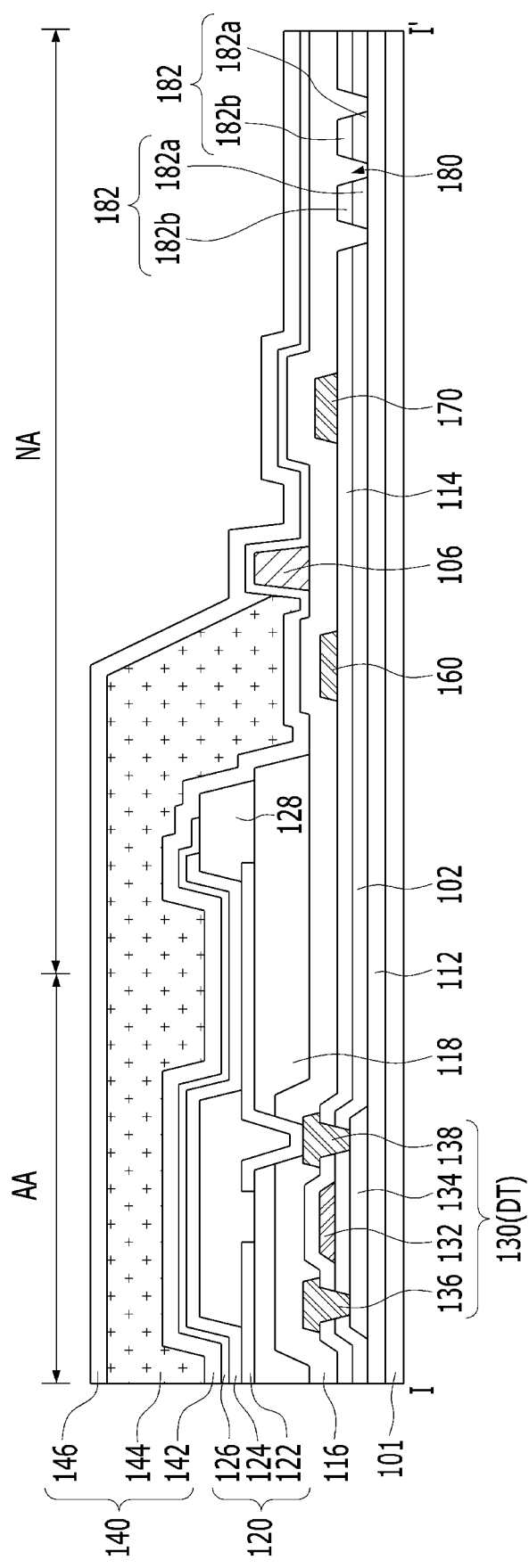
FIG. 3 is a cross-sectional view of the organic light emitting display device, taken along line I-I' of FIG. 1.

Such a driving transistor DT, 130 includes, as exemplarily shown in FIG. 3, a semiconductor layer 134 arranged on a buffer layer 112, a gate electrode 132 overlapping the semiconductor layer 134 with a gate insulating film 102 interposed therebetween, and source and drain electrodes 136 and 138 formed on an interlayer film 114 and contacting the semiconductor layer 134. Here, the semiconductor layer 134 may be formed of at least one of an amorphous semiconductor material, a polycrystalline semiconductor material or an oxide semiconductor material.

The organic light emitting element 120 is electrically connected between a source terminal of the driving transistor DT and the low voltage (EVSS) supply line and emits light by current corresponding to a data signal supplied from the driving transistor DT. For this purpose, the organic light emitting element 120 includes an anode 122 and a cathode 126 disposed opposite to each other with an organic layer 124 therebetween. The anode 122 is connected to the source electrode 138 of the driving transistor DT exposed through a pixel contact hole formed through a protective film 116 and a planarization layer 118, and is exposed by a bank 128 arranged to provide a light emitting area. The organic layer 124 is formed on the anode 122 and the bank 128. The organic layer 124 may include a hole injection layer/a hole transport layer/a light emitting layer/an electron transport layer/an electron injection layer, etc. The cathode 126 is formed on the organic layer 124 so as to be disposed opposite to the anode 122 with the organic layer 124 therebetween.

Therefore, each of the red (R), green (G), blue (B) and white (W) sub-pixels SP controls the magnitude of current flowing from a high voltage power supply (EVDD) to the organic light emitting element 120 using switching of the driving transistor DT according to the data signal, and thus emits light through the light emitting layer of the organic light emitting element 120, thereby expressing a designated color.

An encapsulation structure 140 (which may be referred to herein as encapsulation unit 140) having a multilayer structure is arranged on the organic light emitting element 120. The encapsulation unit 140 prevents external moisture or oxygen from penetrating into the organic light emitting element 120, which is vulnerable to external moisture or oxygen. For this purpose, the encapsulation unit 140 includes a plurality of inorganic encapsulation layers 142 and 146 and an organic encapsulation layer 144 arranged between the inorganic encapsulation layers 142 and 146, and the inorganic encapsulation layer 146 is arranged as the uppermost layer. Here, the encapsulation layer 140 includes at least two inorganic encapsulation layers 142 and 146 and at least one organic encapsulation layer 144. In the present disclosure, a structure of the encapsulation unit 140 in which the organic encapsulation layer 144 is arranged between first and second inorganic encapsulation layers 142 and 146 will be exemplarily described. In the present disclosure, the organic encapsulation layer 144 at least partially covers a side surface of the dam 106, the inorganic encapsulation layer 142 totally covers the dam 106, and the inorganic encapsulation layer 146 at least partially covers the dam 106, in particular, the inorganic encapsulation layer 146 covers a top surface of the dam 106.

The first inorganic encapsulation layer 142 is formed on the cathode 126 so as to be closest to the organic light emitting element 120. The first inorganic encapsulation layer 142 is formed of an inorganic insulating material which may be deposited at a low temperature, such as silicon nitride ($SiN_x$), silicon oxide ($SiO_x$), silicon oxynitride (SiON) or aluminum oxide ($Al_2O_3$). The first inorganic encapsulation layer 142 is deposited in a low temperature atmosphere and may thus prevent damage to a light emitting stack 124, which cannot withstand high temperatures, during the deposition process of the first inorganic encapsulation layer 142.

The organic encapsulation layer 144 serves as a buffer to reduce stress between respective layers due to bending of the organic light emitting display panel 100 and reinforces planarization performance. The organic encapsulation layer 144 is formed of an organic insulating material, such as acrylic resin, epoxy resin, polyimide, polyethylene or silicon oxycarbide (SiOC). Such an organic encapsulation layer 144 may be formed so as to diffuse to the dam 106, or to diffuse to a region in front of the non-active area NA, in which signal pads are arranged, past the dam 106.

The second inorganic encapsulation layer 146 is formed so as to cover the upper and side surfaces of the organic encapsulation layer 144 and the first inorganic encapsulation layer 142. That is, the second inorganic encapsulation layer 146 may be formed not only in the active area AA but also in a remaining region of the non-active area NA except for a region of the non-active area in which the signal pads are arranged. Thereby, the second inorganic encapsulation layer 146 minimizes and prevents penetration of external moisture or oxygen into the first inorganic encapsulation layer 142 and the organic encapsulation layer 144. The second inorganic encapsulation 146 is formed of an inorganic insulating material, such as silicon nitride ($SiN_x$), silicon oxide ($SiO_x$), silicon oxynitride (SiON) or aluminum oxide ($Al_2O_3$).

In the non-active area NA, the power line 160, the dam 106, the crack detection line 170 and the crack prevention layers 182 are arranged.

The power line 160 supplies power voltage including at least one of reference voltage Vref, high voltage EVDD or low voltage EVSS. The power line 160 is arranged to surround the remainder of the active area AA except for one side of the active area AA, to which the circuit film 152 is attached. A gate driving unit (not shown) may be arranged between the power line 160 and the active area AA. The gate driving unit mainly uses a gate-in-panel (GIP) type which is embedded in the non-active area NA (a bezel area) of the display panel 100, and is formed through the same process as thin film transistors arranged in the active area.

If the organic encapsulation layer 144 is formed through an inkjet method, the dam 106 is arranged so as to prevent the organic encapsulation layer 144 of a liquid type from diffusing into the non-active area NA. Such a dam 106 may prevent the organic encapsulation layer 144 from diffusing to the signal pads arranged in the outermost region of the non-active area NA. For this purpose, as shown in FIG. 1, the dam 106 may be formed to completely surround the active area AA, in which the organic light emitting elements 120 are arranged, and thus formed between the active area AA and the non-active area NA.

A plurality of crack prevention layers 182 is formed along the perimeter of the active area AA so as to prevent a crack generated at the edge of the inorganic light emitting display panel 100 from propagating to the active area AA. The crack prevention layers 182 may prevent the organic light emitting elements 120, the transistors ST1, ST2 and DT, the capacitors Cst, signal lines SL, DL and RL and power lines PL, which are arranged in the active area AA, from being damaged. In the present disclosure, the crack prevention layers 182 may be formed partially or totally along the perimeter of the active area AA.

For this purpose, the crack prevention layers 182 are spaced apart from each other by crack prevention holes 180. Here, the crack prevention layers 182 are formed of the same material as at least one of a plurality of inorganic insulating films. For example, the crack prevention layers 182 may include a first crack prevention layer 182*a* formed of the same material as the gate insulating film 102, on the buffer layer 112, and a second crack prevention layer 182*b* formed of the same material as the interlayer film 114, on the first crack prevention layer 182*a*. In the present disclosure, the crack prevention hole 180 may be disposed between the crack prevention layer 182 and the crack detection line 170.

Figure 4A:
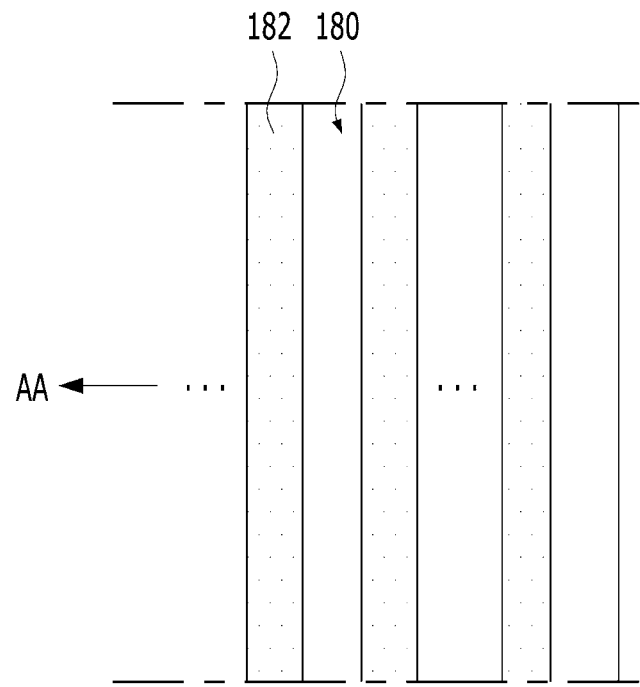
FIGS. 4A to 4C are plan views illustrating crack prevention layers and crack prevention holes shown in FIG. 3.
Figure 4B:
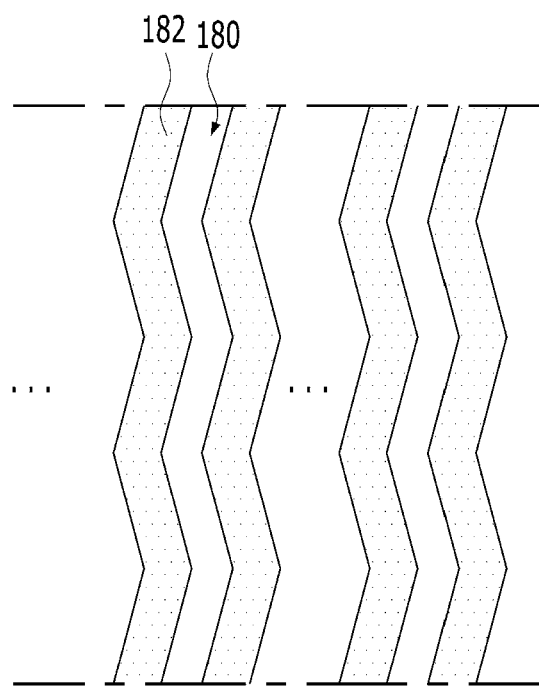
Figure 4C:
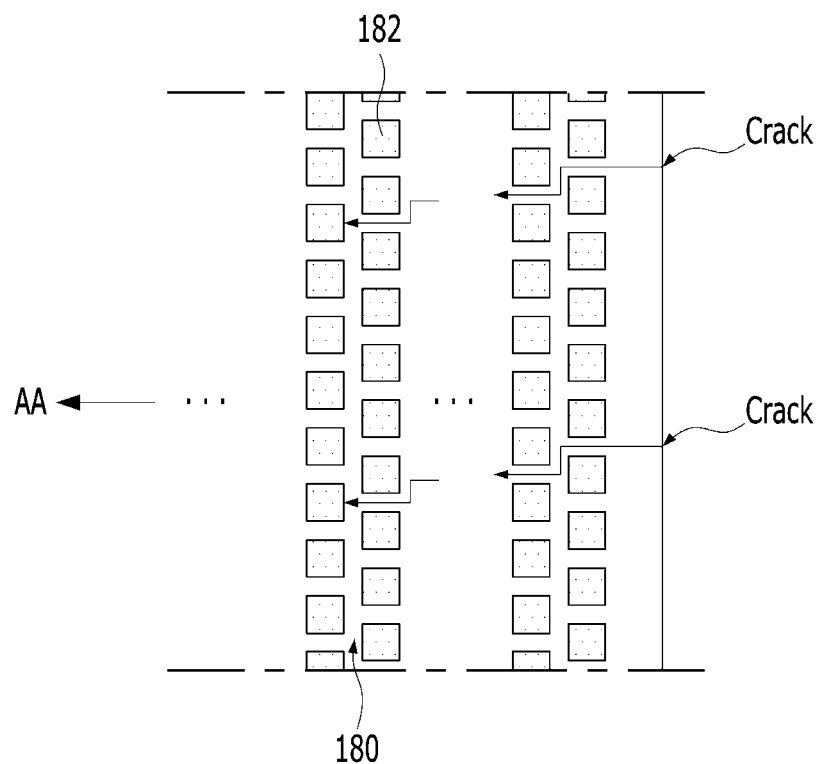

The crack prevention layers 182 may be arranged in a straight line, as exemplarily shown in FIG. 4A, or be arranged in a zigzag line, as exemplarily shown in FIG. 4B, or the crack prevention layers 182 having a polygonal structure, a circular structure or a combined structure thereof may be arranged in a matrix, as exemplarily shown in FIG. 4C. Here, the respective crack prevention layers 182 may have the same shape, or at least one of heights, lengths, widths or shapes of the respective crack prevention layers 182 may be different.

A propagation path of a crack generated at the edge of the display panel 100 is elongated by the crack prevention layers 182 and, thus, it is difficult to propagate cracks to the active area AA. Therefore, the crack prevention layers 182 may prevent cracks generated at the edge of the display panel 100 from damaging the elements 120, ST1, ST2, DT and Cst and the signal lines SL, DL and RL of the active area AA.

Figure 4D:
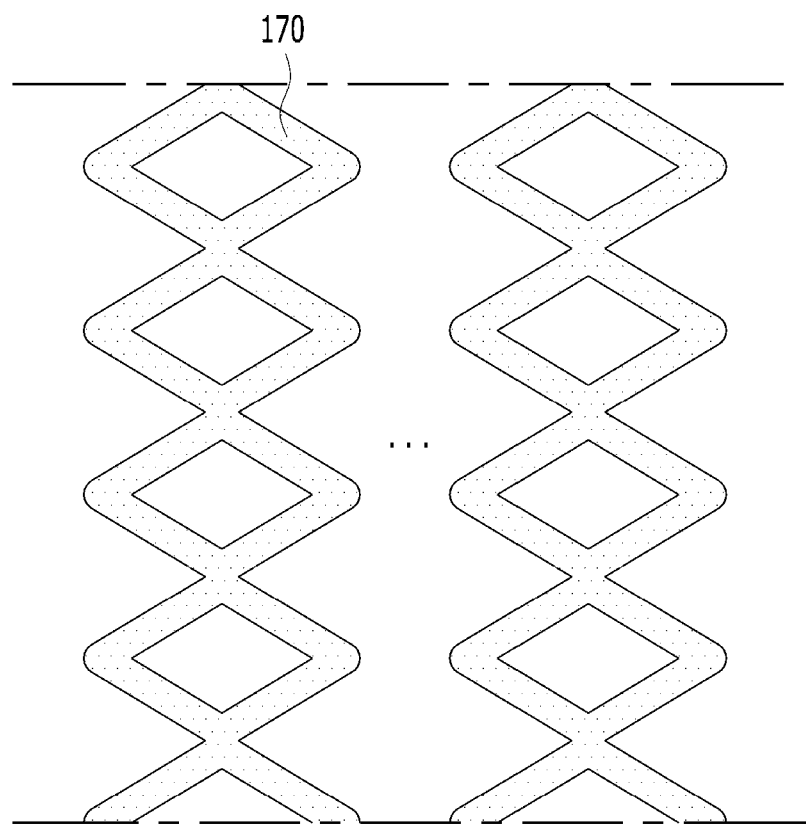
FIG. 4D is a plan view illustrating crack detection lines shown in FIG. 3.

The crack detection line 170 judges whether or not there is a crack having a high strength, which is generated at the edge of the display panel 100 and is thus not blocked by the crack prevention holes 180 and the crack prevention layers 182 and propagates. For this purpose, at least one crack detection line 170 is positioned between at least one of the crack prevention layers 182 and the crack prevention holes 180, and the dam 106. The crack detection line 170 is formed so as to surround at least three sides of the active area AA. For example, the crack detection line 170 is formed in a U-shape or an open frame shape, a part of which is open. Respective sides of the crack detection line 170 may be formed in a straight line or a zigzag line, as exemplarily shown in FIG. 1, along the crack prevention layers 182 shown in FIG. 4A or 4B, or be formed in a shape in which plural diamonds having a vacant central area are connected in a line (e.g., a plurality of diamond shapes connected to one another with each of the diamond shapes having a vacant central area), as exemplarily shown in FIG. 4D. The crack detection line 170 is formed of the same material as at least one of the gate electrode 132, the source electrode 136 or the drain electrode 138 of the driving transistor DT, on the same layer as the at least one of the gate electrode 132, the source electrode 136 or the drain electrode 138 of the driving transistor DT.

Crack detection terminals 164 connected to both ends of the crack detection line 170 are positioned on the circuit film 152, the printed circuit board or the non-active area NA, as exemplarily shown in FIG. 1. A resistance measurement circuit (or unit) contacts the crack detection terminals 164 and thus measures an output resistance value from the crack detection line 170. If the output resistance value is detected as an infinite value, it is judged that a crack is generated at the crack detection line 170 and thus propagates to the active area AA. Further, if the output resistance value is detected as a proper value which is smaller than the infinite value, it is judged that no crack is generated at the crack detection line 170.

As such, in the present disclosure, the crack detection line 170 is positioned between the crack prevention layers 182 and the active area AA. Whether or not a crack propagates to the active area AA may be judged by measuring the output resistance value from the crack detection line 170 during inspection of each unit process or during final inspection. Thereby, in the present disclosure, a dark spot generated by penetration of moisture or oxygen into a crack may be prevented and, thus, reliability may be improved. Further, in the present disclosure, whether or not a crack is generated may be judged through inspection prior to product shipping and, thus, yield may be increased.

Figure 5:
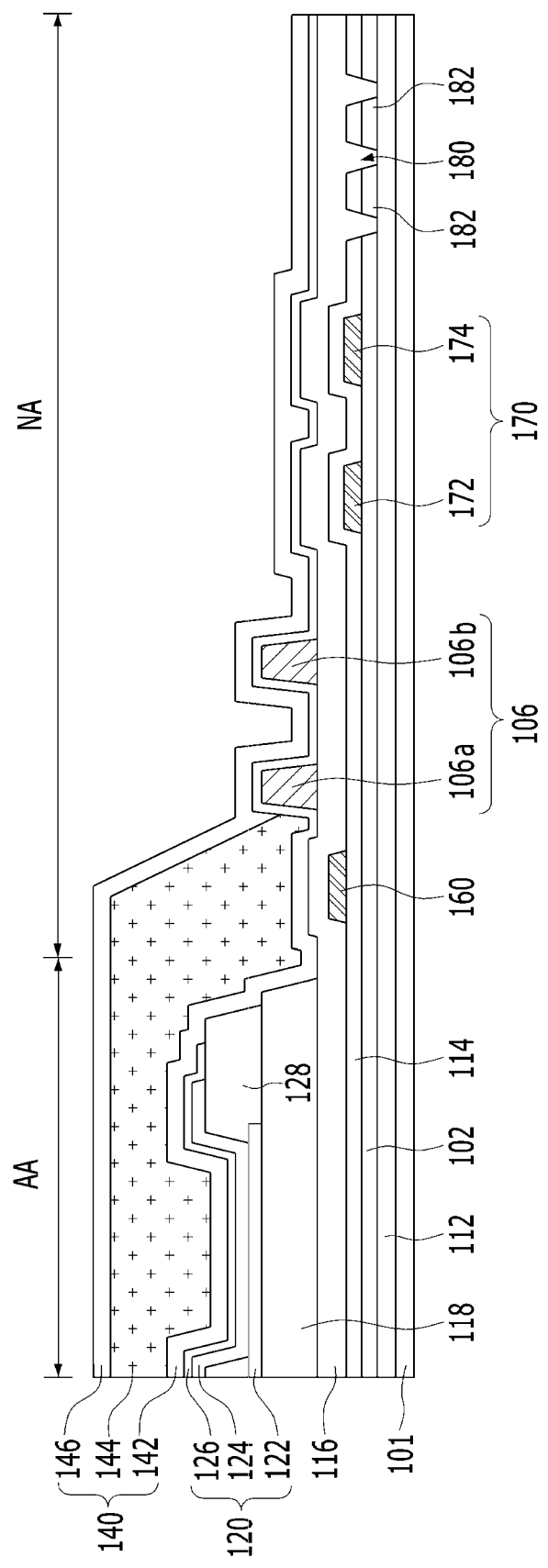
FIG. 5 is a cross-sectional view illustrating an organic light emitting display device in accordance with another embodiment of the present disclosure.

FIG. 5 is a cross-sectional view illustrating an organic light emitting display device in accordance with another embodiment of the present disclosure.

The organic light emitting display device shown in FIG. 5 includes the same elements as the organic light emitting display device shown in FIG. 3 except that a plurality of dams 106 is arranged and a plurality of crack detection lines 170 is arranged in a horizontal direction on the same plane. Therefore, a detail description of the elements of the organic light emitting display device in accordance with this embodiment, which are the same as those of the organic light emitting display device in accordance with the earlier embodiment, will be omitted.

Figure 6:
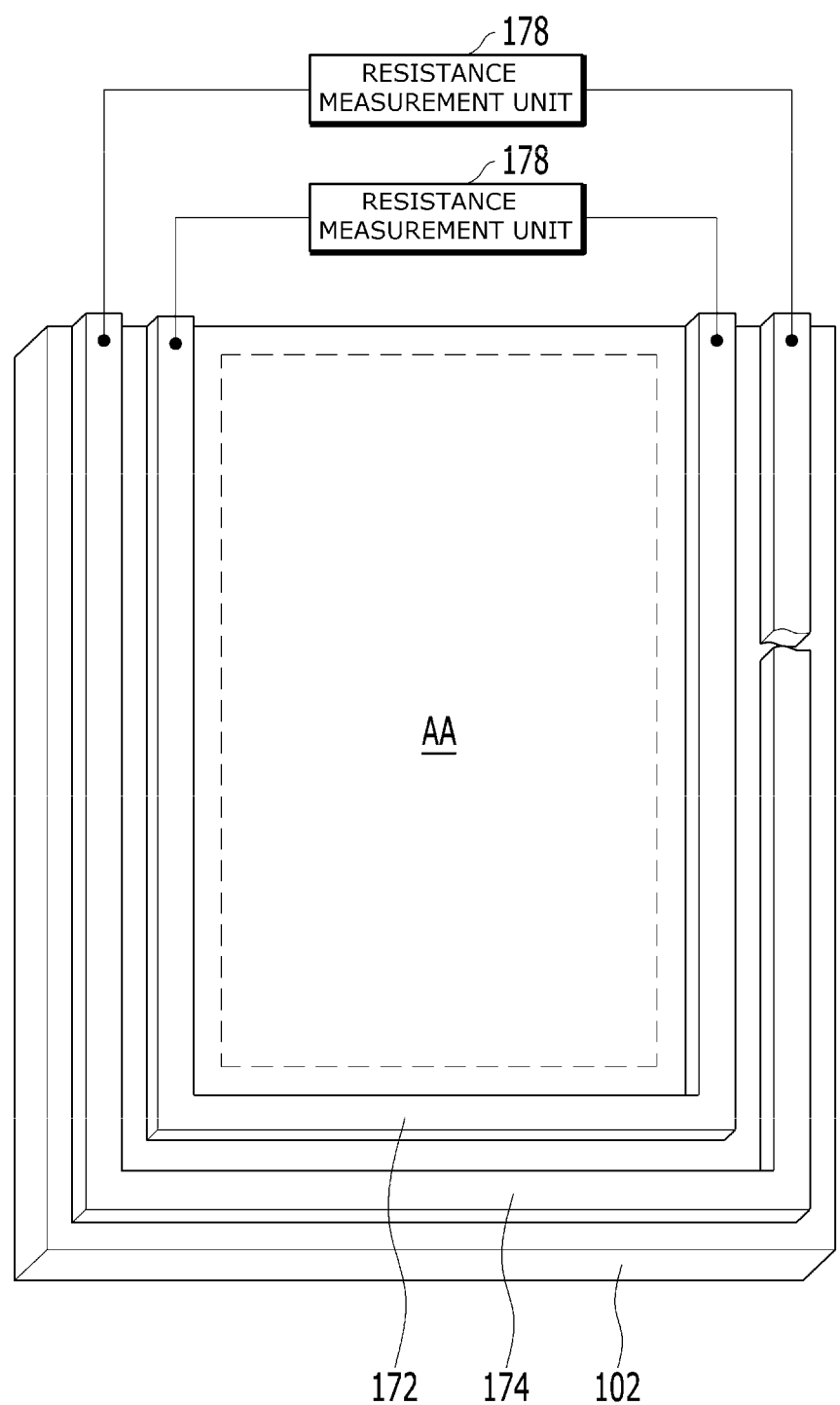
FIG. 6 is a plan view illustrating resistance measurement units to measure output resistances of crack detection lines shown in FIG. 5.

The dams 106 shown in FIG. 5 are arranged in parallel between a non-active area NA and an active area AA. For example, the dams 106 include a first dam 106a adjacent to the active area AA and a second dam 106b adjacent to the non-active area NA. Both the first and second dam 106a, 106b may be positioned in the non-active area NA, with the first dam 106a being positioned between the active area AA and the second dam 106b. The first and second dams 106a and 106b prevent an organic encapsulation layer 144 of a liquid type from diffusing to signals pads of the non-active area NA, when the organic encapsulation layer 144 of the liquid type is dropped onto the active area AA. The crack detection lines 170 are positioned between crack prevention layers 182 and the active area AA and detect the horizontal position of a crack. For example, the crack detection lines 170 include first and second crack detection lines 172 and 174 which are arranged in parallel in the horizontal direction on the same plane, i.e., a gate insulating film 102, as exemplarily shown in FIG. 6. Here, the crack detection lines 170 are not limited to the structure and the number shown in FIGS. 5 and 6, and two or more crack detection lines 170 may be arranged on the substrate, either adjacent to each other or in different locations.

The first crack detection line 172 is positioned adjacent to the active area AA, and the second crack detection line 174 is positioned between the first crack detection line 172 and crack prevention layers 182. The first and second crack detection lines 172 and 174 are formed of the same material as one of a gate electrode 132 and a source electrode 136, on the same layer as the one of the gate electrode 132 and the source electrode 136. For example, the first and second crack detection lines 172 and 174 are formed of the same material as the source electrode 136, on an interlayer film 114. Output resistance values from the first and second crack detection lines 172 and 174 are measured by resistance measurement circuits 178 (which may be referred to herein as resistance measurement units 178). The resistance measurement circuits 178 may include any circuitry operable to measure resistances of the first and second crack detection lines 172 and 174, including, for example, circuitry which applies a known current and determines the resistance by measuring the resulting voltage, and/or circuitry which applies a known voltage and determines the resistance by measuring the resulting current. Other circuitry may be suitable for use as the resistance measurement circuits 178, including any circuitry operable to detect electrical continuity of the first and second crack detection lines 172 and 174 (e.g., when the crack detection lines 172 and 174 are unbroken) and to detect an open circuit condition (e.g., an infinite or very high resistance), such as when there is a crack through at least one of the first and second crack detection lines 172 and 174.

If both the output resistance values from the first and second crack detection lines 172 and 174 are measured as infinite values, it is judged that a crack propagates to the active area AA and thus a corresponding display panel 100 is defective. Further, if both the output resistance values from the first and second crack detection lines 172 and 174 are measured as proper values, it is judged that no crack propagates to the active area AA and thus the corresponding display panel 100 is normal. Further, if the output resistance value from the first crack detection line 172 is measured as a proper value which is lower than an infinite value and the output resistance value from the second crack detection line 174 is measured as an infinite value, it is judged that a crack propagates to a region between the first and second crack detection lines 172 and 174 but does not propagate to the active area AA and thus the corresponding display panel 100 is normal.

As such, in the organic light emitting display device in accordance with this embodiment of the present disclosure, a plurality of crack detection lines 170 is arranged in parallel in the horizontal direction between the crack prevention layers 182 and the active area AA. Not only whether or not a crack propagates to the active area AA but also the horizontal position of the crack may be judged by measuring the output resistance values from the crack detection lines 170 during inspection of each unit process or during final inspection. Thereby, in the present disclosure, a dark spot generated by penetration of moisture or oxygen into a crack may be prevented and, thus, reliability may be improved. Further, in the present disclosure, whether or not a crack is generated may be judged through inspection prior to product shipping and, thus, yield may be increased.

FIG. 7 is a cross-sectional view illustrating an organic light emitting display device in accordance with another embodiment of the present disclosure.

The organic light emitting display device shown in FIG. 7 includes the same elements as the organic light emitting display device shown in FIG. 3 except that a plurality of crack detection lines 170 is arranged in vertical and horizontal directions. Therefore, a detail description of the elements of the organic light emitting display device in accordance with this embodiment, which are the same as those of the organic light emitting display device in accordance with the earlier embodiment, will be omitted.

The crack detection lines 170 shown in FIG. 7 are positioned between crack prevention layers 182 and an active area AA and detect the horizontal and vertical positions of a crack. For example, the crack detection lines 170 include first and second crack detection lines 172 and 174. Here, the crack detection lines 170 are not limited to the structure and the number shown in FIG. 7, and two or more crack detection lines 170 may be arranged on the substrate, either adjacent to each other or in different locations.

The first crack detection lines 172 are positioned adjacent to the active area AA. The first crack detection lines 172 include a first lower crack detection line 172a and a first upper crack detection line 172b which are arranged on different planes. The first lower crack detection line 172a may overlap the first upper crack detection line 172b with at least one insulating film therebetween, as exemplarily shown in FIG. 7, or the first lower crack detection line 172a and the first upper crack detection line 172b may be alternately arranged, as exemplarily shown in FIG. 8. For example, the first lower crack detection line 172a is formed of the same material as a gate electrode 132, on a gate insulating film 102, and the first upper crack detection line 172b is formed of the same material as source and drain electrodes 136 and 138, on an interlayer film 114. In this case, the first lower crack detection line 172a and the first upper crack detection line 172b overlap each other or are alternately arranged with the interlayer film 114 therebetween. The term "overlap" is used herein to indicate that any two or more elements are arranged in an overlapping manner, and does not otherwise indicate a specific positional relationship between the two or more elements. For example, the first lower crack detection line 172a may overlap the first upper crack detection line 172b even though the first upper crack detection line 172b may be oriented above the first lower crack detection line 172a, as shown in FIG. 7.

The second crack detection lines 174 are positioned between the first crack detection lines 172 and the crack prevention layers 182. The second crack detection lines 174 include a second lower crack detection line 174a and a second upper crack detection line 174b which are arranged on different planes. The second lower crack detection line 174a may overlap the second upper crack detection line 174b with at least one insulating film therebetween. For example, the second lower crack detection line 174a is formed of the same material as the gate electrode 132, on the gate insulating film 102, and the second upper crack detection line 174b is formed of the same material as the source and drain electrodes 136 and 138, on the interlayer film 114. In this case, the second lower crack detection line 174a and the second upper crack detection line 174b overlap each other or are alternately arranged with the interlayer film 114 therebetween.

Figure 9:
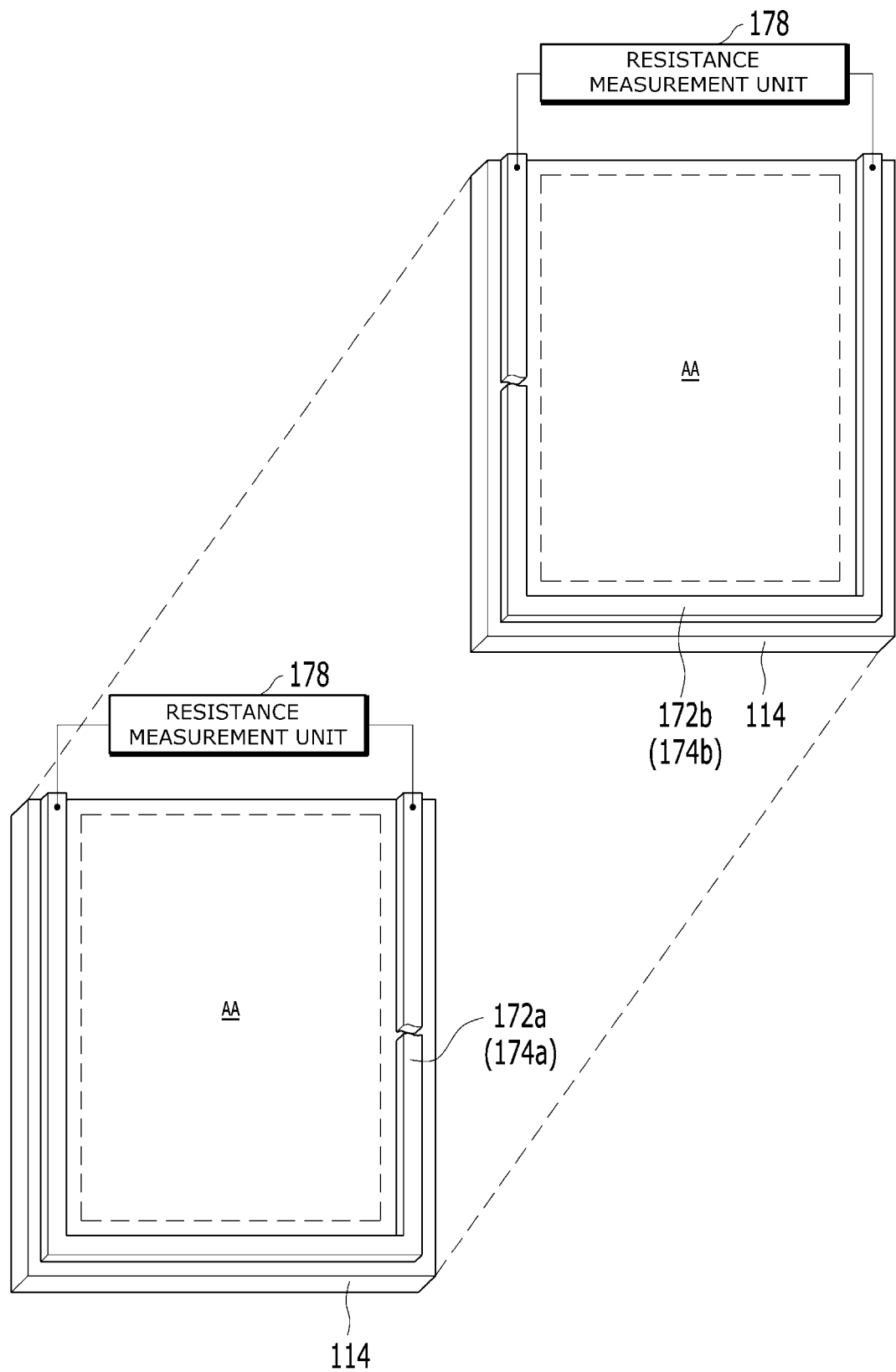
FIG. 9 is a plan view illustrating resistance measurement units to measure output resistances of the crack detection lines shown in FIG. 7.

Output resistance values from the first and second lower crack detection lines 172a and 174a and the first and second upper crack detection lines 172b and 174b are respectively measured by resistance measurement units 178, as exemplarily shown in FIG. 9.

If both the output resistance values from the first and second lower crack detection lines 172a and 174a and the first and second upper crack detection lines 172b and 174b are measured as infinite values, it is judged that a crack propagates to the active area AA and thus a corresponding display panel 100 is defective.

If both the output resistance values from the first and second lower crack detection lines 172a and 174a and the first and second upper crack detection lines 172b and 174b are measured as proper values, it is judged that no crack propagates to the active area AA and thus the corresponding display panel 100 is normal.

If the output resistance values from the first and second lower crack detection lines 172a and 174a are measured as proper values and the output resistance values from the first and second upper crack detection lines 172b and 174b are measured as infinite values, it is judged that a crack does not propagate up to the first and second lower crack detection lines 172a and 174a.

If the output resistance values from the first lower and upper crack detection lines 172a and 172b are measured as proper values and the output resistance values from the second lower and upper crack detection lines 174a and 174b are measured as infinite values, it is judged that a crack does not propagate up to the first lower and upper crack detection lines 172a and 172b.

As such, in the organic light emitting display device in accordance with this embodiment of the present disclosure, a plurality of crack detection lines 170 is arranged in parallel in the horizontal and vertical directions between the crack prevention layers 182 and the active area AA. The horizontal and vertical positions of a crack may be judged by measuring the output resistance values from the crack detection lines 170 during inspection of each unit process or during final inspection and, thus, whether or not the crack propagates to the active area AA may be judged. Thereby, in the present disclosure, a dark spot generated by penetration of moisture or oxygen into a crack may be prevented and, thus, reliability may be improved. Further, in the present disclosure, whether or not a crack is generated may be judged through inspection prior to product shipping and, thus, yield may be increased.

Figure 10:
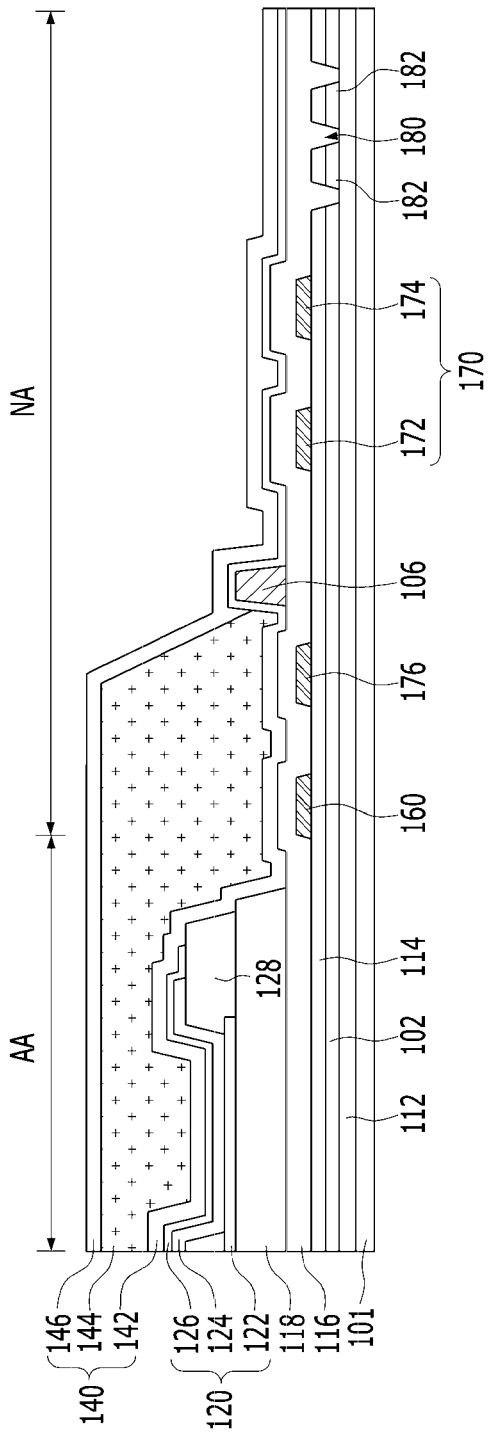
FIG. 10 is a cross-sectional view illustrating an organic light emitting display device in accordance with another embodiment of the present disclosure.

FIG. 10 is a cross-sectional view illustrating an organic light emitting display device in accordance with another embodiment of the present disclosure.

The organic light emitting display device shown in FIG. 10 includes the same elements as the organic light emitting display device shown in FIG. 3 except that an auxiliary crack detection line 176 to judge whether or not a crack propagates to the inside of an active area AA is further provided. Therefore, a detail description of the elements of the organic light emitting display device in accordance with this embodiment, which are the same as those of the organic light emitting display device in accordance with the earlier embodiment, will be omitted.

The auxiliary crack detection line 176 is positioned inside a dam 106. That is, the auxiliary crack detection line 176 is arranged in parallel to a power line 160, between the dam 106 and the power line 160. Whether or not a crack propagates to an area inside the dam 106 is judged by measuring an output resistance value from the auxiliary crack detection line 176. Therefore, the organic light emitting display device shown in FIG. 10 may not only judge whether or not a crack propagates to the active area AA from the non-active area NA through crack detection lines 170 but also judge whether or not the crack propagates to the inside of the active area AA through the auxiliary crack detection line 176.

That is, if the output resistance value from the auxiliary crack detection line 176 is measured as an infinite value, it is judged that a crack propagates to the area inside the dam 106, i.e., the inside of the active area AA, and thus a corresponding display panel 100 is defective. If the output resistance value from the auxiliary crack detection line 176 is measured as a proper value which is lower than the infinite value, it is judged that a crack does not propagate to the area inside the dam 106, i.e., the inside of the active area AA, and thus the corresponding display panel 100 is normal.

Figure 11:
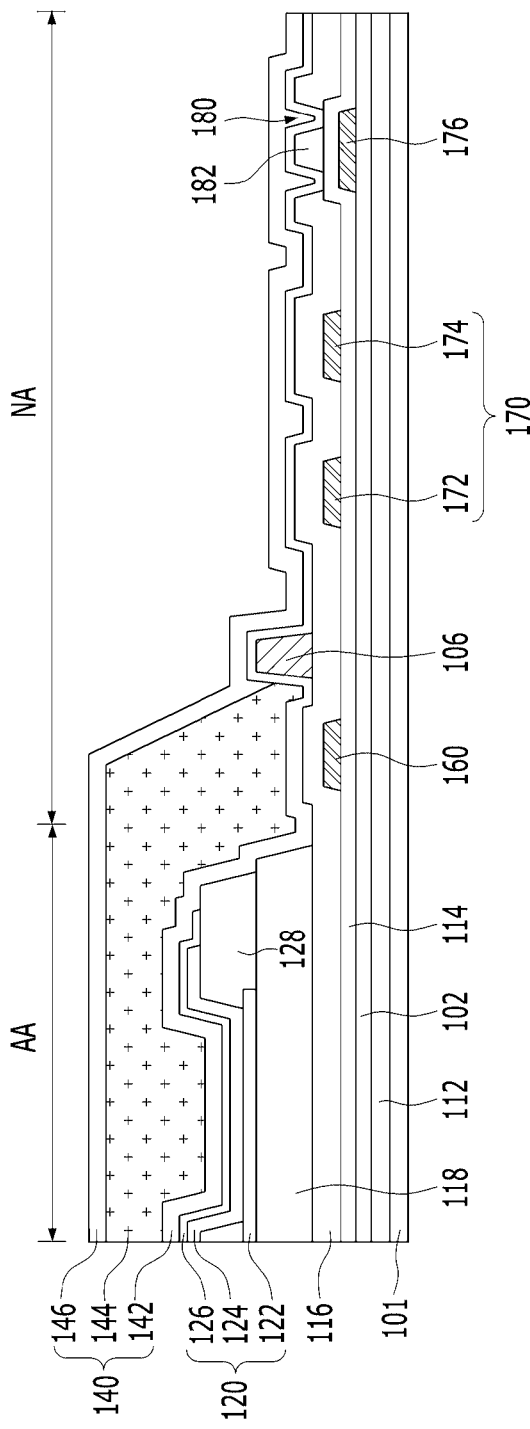
FIG. 11 is a cross-sectional view illustrating another embodiment of crack detection lines shown in FIG. 10.

Besides, an auxiliary crack detection line 176 may be arranged so as to overlap a crack prevention layer 182, as exemplarily shown in FIG. 11. Thereby, dimensions of a non-active area NA, i.e., a bezel area, occupied by the auxiliary crack detection line 176 may be reduced and, thus, the bezel area may be minimized.

Figure 12:
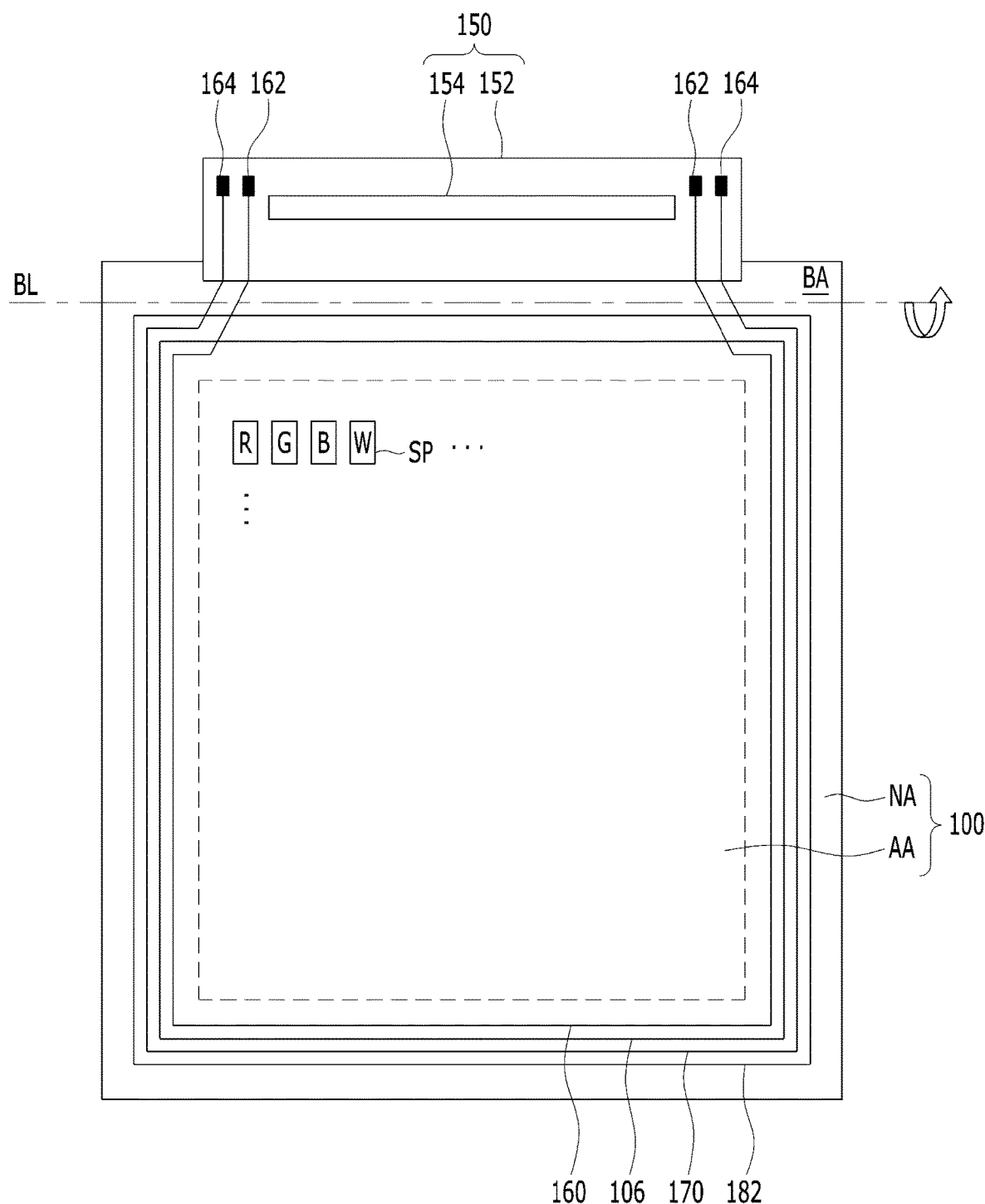
FIG. 12 is a plan view illustrating an organic light emitting display device in accordance with yet another embodiment of the present disclosure.

FIG. 12 is a plan view illustrating an organic light emitting display device in accordance with yet another embodiment of the present disclosure.

The organic light emitting display device shown in FIG. 12 includes the same elements as the organic light emitting display device shown in FIG. 3 except that a bending area BA is provided within a non-active area NA so that the organic light emitting display device is bendable. Therefore, a detail description of the elements of the organic light emitting display device in accordance with this embodiment, which are the same as those of the organic light emitting display device in accordance with the earlier embodiment, will be omitted.

The bending area BA shown in FIG. 12 is an area, which is bent towards the rear surface of the active area AA based on a bending line BL, and corresponds to an area arranged between an upper region of the active area AA and a circuit film 152. Therefore, out of the entire screen of the organic light emitting display device, dimensions occupied by the active area AA are maximized and dimensions occupied by a bezel area corresponding to the non-active area NA are minimized.

Crack prevention holes 180 and crack prevention layers 182 are positioned between the bending area BA and the active area AA and may thus prevent a crack from propagating to the active area AA due to stress generated during bending of the bending area BA.

Figure 13:
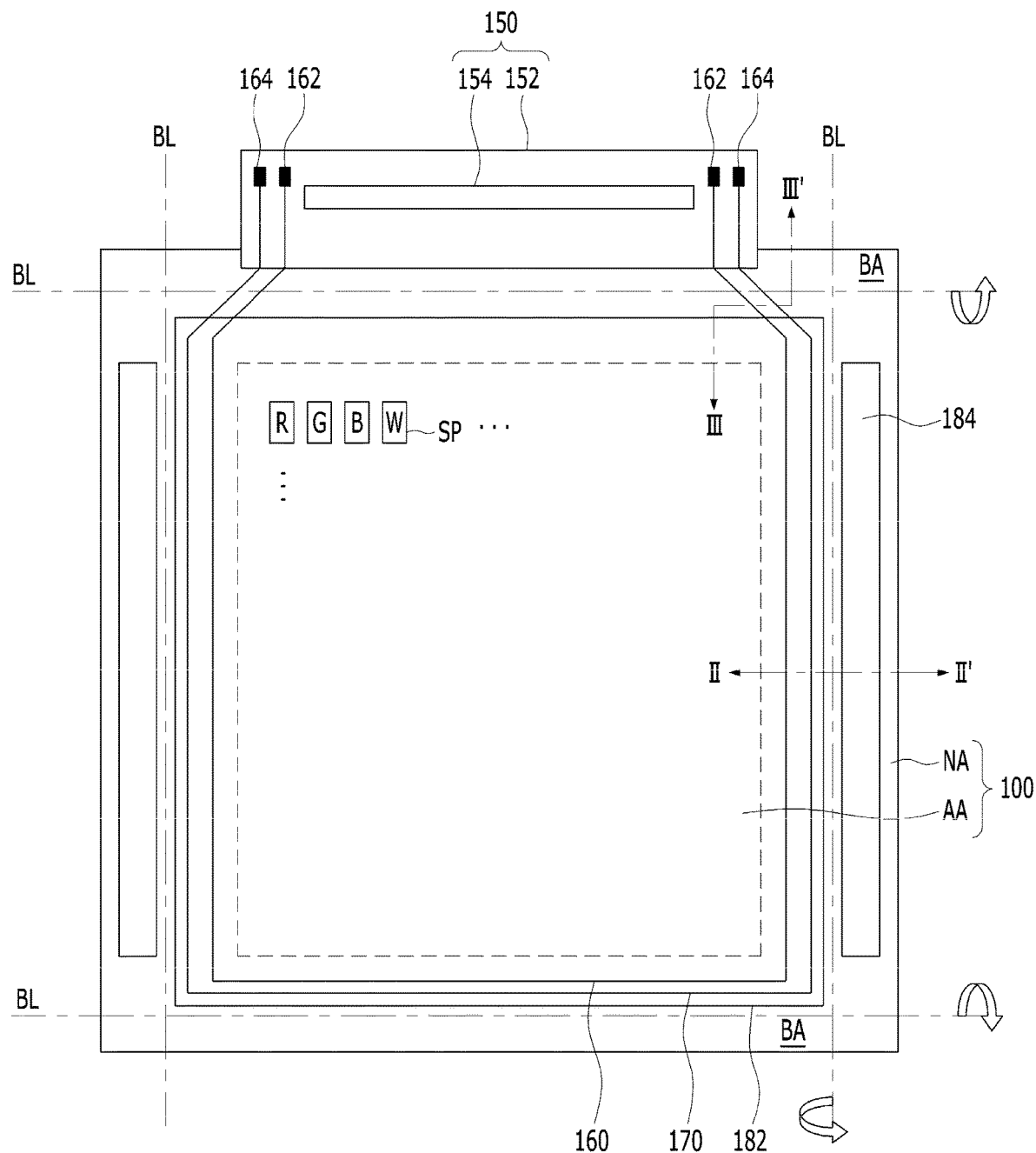
FIG. 13 is a plan view illustrating another embodiment of a bending area shown in FIG. 12.
Figure 14:
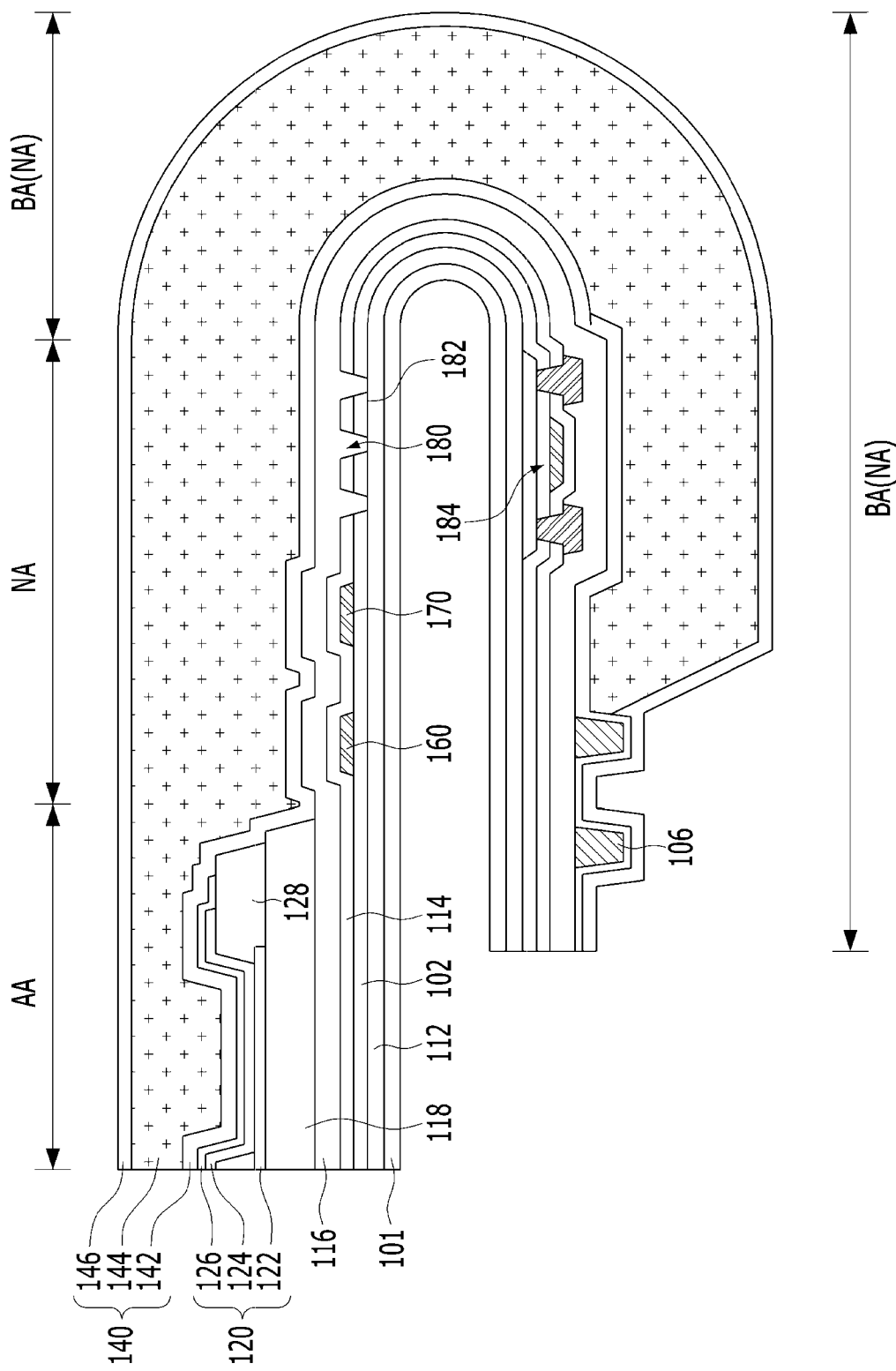
FIG. 14 is a cross-sectional view of the organic light emitting display device, taken along line II-II' of FIG. 13.

Although FIG. 12 exemplarily illustrates a structure in which the bending area BA is arranged at one side of the active area AA, bending areas BA may be arranged at up to four sides of the active area AA, as exemplarily shown in FIG. 13. The bending area BA in which a gate driving unit 184 and a circuit film 152 are arranged is bent towards the rear surface of the active area AA based on the bending line BL, as exemplarily shown in FIG. 14.

Figure 15:
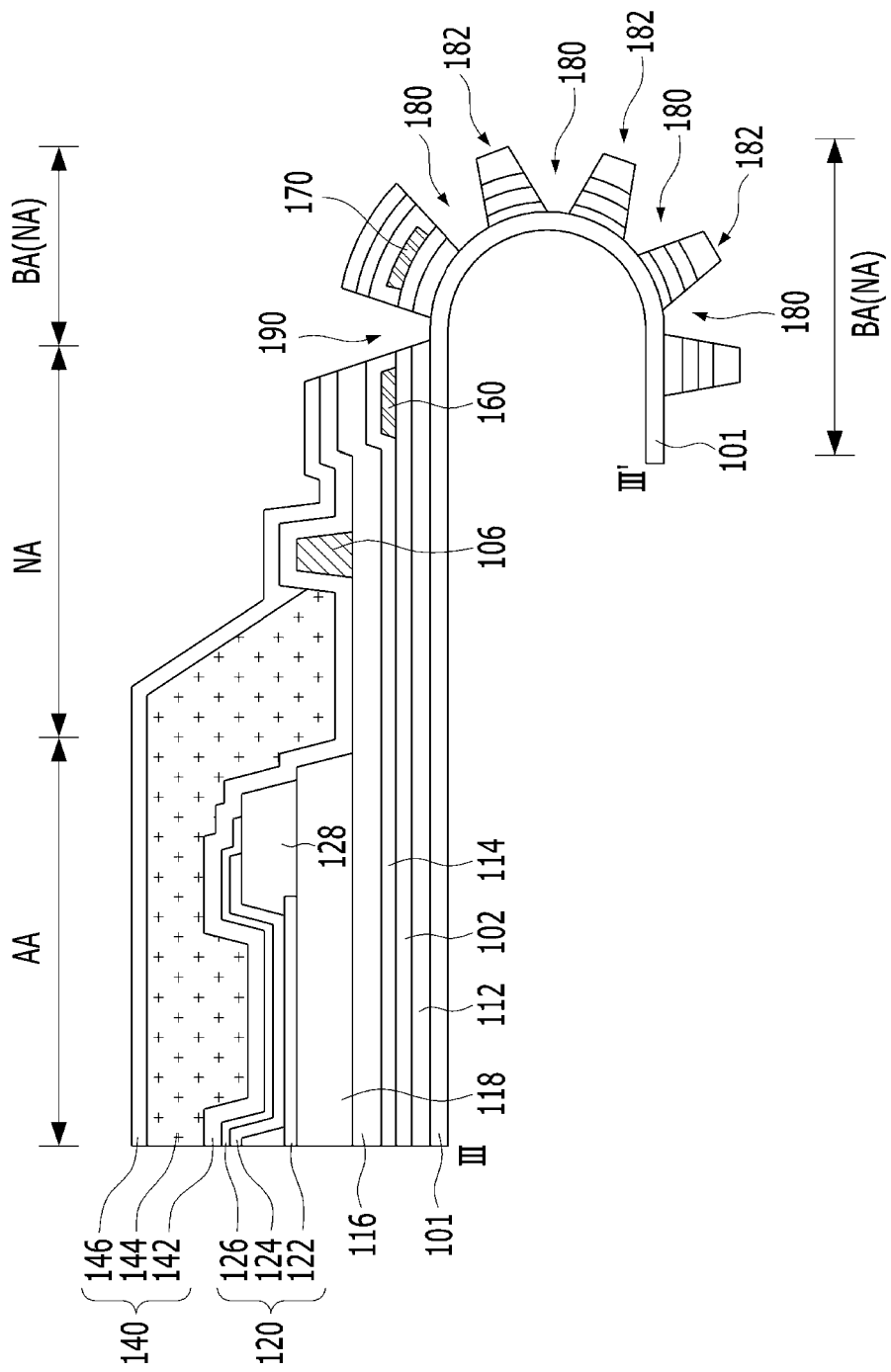
FIG. 15 is a cross-sectional view of the organic light emitting display device, taken along line III-III' of FIG. 13.

In this case, at least one of crack prevention holes 180, crack prevention layers 182 or crack detection lines 170 is positioned between the active area AA and the bending area BA. Particularly, at least one of the crack prevention holes 180, the crack prevention layers 182 or the crack detection lines 170 is arranged between the gate driving unit 184 positioned in the bending area BA and the active area AA, as exemplarily shown in FIG. 14. Second crack prevention holes 190 to expose a substrate 101 are positioned between the power supply line 160 and the crack detection line 170 positioned in the bending area BA, as exemplarily shown in FIG. 15. The second crack prevention holes 190 are formed by removing at least one inorganic insulating film selected from the group consisting of a buffer layer 112, a gate insulating film 102, an interlayer film 114 and first and second inorganic encapsulation layers 142 and 146, which are formed of inorganic insulating materials, between the crack detection line 170 and the power supply line 160. Thereby, propagation of a crack, generated during bending of the bending area BA, to the active area AA through the inorganic insulating films may be prevented.

The crack prevention holes 180 and the crack prevention layers 182 are positioned between the bending area BA and the crack detection line 170 and prevent a crack from propagating to the active area AA due to stress generated during bending of the bending area BA. The crack detection line 170 is positioned between the crack prevention layers 182 and the active area AA and judges whether or not a crack propagates to the active area AA due to stress generated during bending of the bending area BA.

As such, in the organic light emitting display device in accordance with this embodiment of the present disclosure, the crack detection lines 170 are arranged between the bending area BA and the active area AA. The horizontal and vertical positions of a crack may be judged by measuring the output resistance values from the crack detection lines 170 during inspection of each unit process or during final inspection and, thus, whether or not the crack propagates to the active area AA may be judged. Thereby, in the present disclosure, a dark spot generated by penetration of moisture or oxygen into a crack may be prevented and, thus, reliability may be improved. Further, in the present disclosure, whether or not a crack is generated may be judged through inspection prior to product shipping and, thus, yield may be increased.

Although the organic light emitting display panel 100 including the substrate 101 in accordance with the present disclosure is exemplarily described, the present disclosure is applicable to an organic light emitting display panel without a substrate so as to implement a slim and flexible structure. In this case, an organic light emitting display panel without a substrate is manufactured by forming a plurality of light emitting elements 120 on a substrate 101 and then removing the substrate 101.

As apparent from the above description, in an organic light emitting display device in accordance with the present disclosure, at least one crack detection line is positioned between crack prevention layers and an active area. Whether or not a crack propagates to the active area may be judged by measuring an output resistance value from the crack detection line during inspection of each unit process or during final inspection. Thereby, in the present disclosure, a dark spot generated by penetration of moisture or oxygen into a crack may be prevented and, thus, reliability may be improved. Further, in the present disclosure, whether or not a crack is generated may be judged through inspection prior to product shipping and, thus, yield may be increased.

The present disclosure also relates to and is not limited to the following aspects.

In the present disclosure, the power line and the crack detection line are disposed in parallel with each other.

In the present disclosure, the power line partially overlaps the dam and the crack prevention layer, and the crack detection line partially overlaps the crack prevention layer.

In the present disclosure, the organic encapsulation layer at least partially covers a side surface of the dam.

In the present disclosure, the plurality of inorganic encapsulation layers comprises a first inorganic encapsulation layer and a second inorganic encapsulation layer, wherein the first inorganic encapsulation layer totally covers the dam, and the second inorganic encapsulation layer at least partially covers the dam.

In the present disclosure, the second inorganic encapsulation layer covers a top surface of the dam.

In the present disclosure, at least one crack prevention holes is disposed between the crack prevention layer and the crack detection line.

In the present disclosure, a bending area is disposed in the non-active area, and at least one of the crack prevention layer and the at least one crack detection line is positioned between the bending area and the active area.

In the present disclosure, the power line and the crack detection line are parallel with each other in a bending area.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device, comprising:
   light emitting elements positioned in an active area of the display device;
   at least one crack prevention hole positioned in a non-active area of the display device, the non-active area positioned adjacent to a perimeter of the active area, and the at least one crack prevention hole exposing a buffer layer;
   at least one dam surrounding the active area and positioned inwardly from the at least one crack prevention hole;
   at least one crack detection line positioned adjacent to the at least one dam; and
   at least one protective film covering the at least one crack prevention hole.

2. The organic light emitting display device according to claim 1, wherein the at least one crack prevention hole penetrates an interlayer film and a gate insulating film to expose the buffer layer.

3. The organic light emitting display device according to claim 1, further comprising:
   at least one crack prevention layer adjacent to the at least one crack prevention hole.

4. The organic light emitting display device according to claim 3, wherein the at least one crack prevention layer comprises two or more crack prevention layers.

5. The organic light emitting display device according to claim 3, wherein the at least one crack prevention layer comprises an interlayer film and a gate insulating film.

6. The organic light emitting display device according to claim 1, further comprising:
   thin film transistors electrically connected to the light emitting elements,
   wherein the at least one crack detection line includes a same material as one of gate electrodes and source electrodes of the thin film transistors.

7. The organic light emitting display device according to claim 6, wherein at least one crack detection line is positioned on a same layer as the one of gate electrodes and the source electrodes of the thin film transistors.

8. The organic light emitting display device according to claim 1, wherein the at least one crack detection line comprises a plurality of crack detection lines positioned on different planes to overlap each other or to be alternately disposed.

9. The organic light emitting display device according to claim 8, further comprising:
   thin film transistors electrically connected to the light emitting elements,
   wherein the at least one crack detection lines comprise:
   a lower crack detection line comprising a same material as gate electrodes of the thin film transistors, and positioned on a same layer as the gate electrodes of the thin film transistors; and
   an upper crack detection line comprising a same material as source electrodes of the thin film transistors, and positioned on a same layer as the source electrodes of the thin film transistors.

10. The organic light emitting display device according to claim 9, further comprising:
    an interlayer film positioned between the lower crack detection line and the upper crack detection line.

11. The organic light emitting display device according to claim 1, further comprising:
    a power line positioned between the dam and the active area; and
    an auxiliary crack detection line positioned between the power line and the dam.

12. The organic light emitting display device according to claim 11, wherein the power line and the crack detection line are disposed in parallel with each other.

13. The organic light emitting display device according to claim 11, wherein the power line partially overlaps the dam and the crack prevention layer, and the crack detection line partially overlaps the crack prevention layer.

14. The organic light emitting display device according to claim 1, further comprising:
    an auxiliary crack detection line positioned under the crack prevention layer to overlap the crack prevention layer.

15. The organic light emitting display device according to claim 1, wherein:
    an output resistance value of the at least one crack detection line is an infinite value when the at least one crack detection line has at least one crack therein; and
    the output resistance value of the at least one crack detection line is less than the infinite value when the at least one crack detection line does not have any cracks therein.

16. An organic light emitting display device, comprising:
    light emitting elements positioned in an active area of the display device;
    a crack prevention layer positioned in a non-active area of the display device, the non-active area positioned adjacent to a perimeter of the active area;
    at least one dam surrounding the active area;
    at least one crack detection line positioned between the dam and the crack prevention layer; and a power line positioned inwardly or outwardly from the at least one dam and overlapping with at least a portion of the at least one dam, wherein the power line, in operation, supplies power voltage including at least one of reference voltage, high voltage, or low voltage.

17. The organic light emitting display device according to claim 16, wherein:

an output resistance value of the at least one crack detection line is an infinite value when the at least one crack detection line has at least one crack therein; and the output resistance value of the at least one crack detection line is less than the infinite value when the at least one crack detection line does not have any cracks therein.

18. The organic light emitting display device according to claim 16, further comprising:

thin film transistors electrically connected to the light emitting elements, wherein the at least one crack detection line comprises a same material as one of gate electrodes and source electrodes of the thin film transistors.

19. The organic light emitting display device according to claim 16, further comprising:

an encapsulation structure including at least one inorganic encapsulation layers and an organic encapsulation layer.

20. The organic light emitting display device according to claim 16, wherein the at least one crack detection line is covered by a protective film.

* * * * *